United States Patent [19]

Lacroix et al.

[11] Patent Number: 5,706,180
[45] Date of Patent: Jan. 6, 1998

[54] ELECTRONIC DEVICE PROTECTED FROM SHOCKS BY ENCAPSULATION

[75] Inventors: Marc Lacroix, Saint Cheron; Claude Bouyon, Chatillon, both of France

[73] Assignee: Aerospatiale Societe Nationale Industrielle, Paris, France

[21] Appl. No.: 642,882

[22] Filed: May 6, 1996

[30] Foreign Application Priority Data

May 18, 1995 [FR] France .................... 95 05907

[51] Int. Cl.⁶ ........................................ H05K 7/14
[52] U.S. Cl. .................... 361/800; 361/816; 361/767; 361/752; 361/765; 361/810; 361/807
[58] Field of Search ................... 361/800, 816, 361/761, 762, 765, 767, 771, 736, 752, 301.3, 810, 807, 808; 174/35 R, 35 GC, 35 MS

[56] References Cited

U.S. PATENT DOCUMENTS

| | | |
|---|---|---|
| 4,823,700 | 4/1989 | Alker et al. |
| 5,285,559 | 2/1994 | Thompson et al. ............ 29/841 |
| 5,369,399 | 11/1994 | Tribbey et al. ............ 340/686 |

FOREIGN PATENT DOCUMENTS

WO 87/06091  10/1987  WIPO.

OTHER PUBLICATIONS

"Rigid assembly takes cannon-launch g", Electronics Int., vol. 50, No. 17, Aug. 1977, pp. 50 and 52.

Primary Examiner—Leo P. Picard
Assistant Examiner—Anthony Dinkins
Attorney, Agent, or Firm—Fisher, Christen & Sabol

[57] ABSTRACT

An electronic device (1) includes a set of boards (2) carrying electronic components (3). The boards are mounted so as to be separated from and parallel to one another. The electronic device (1) is capable of withstanding shocks in a defined direction approximately orthogonal to the planes of the boards (2). The electronic device (1) also includes a protective body (5) made of an elastomeric substance encapsulating the set of boards (2). The elastomeric substance fills the spaces between the boards (2) and forms at least one front shield (6), in the direction of the shocks ($\vec{E}$) for the set of boards (2).

11 Claims, 1 Drawing Sheet

ELECTRONIC DEVICE PROTECTED FROM SHOCKS BY ENCAPSULATION

The present invention relates to an electronic device comprising a set of boards carrying electronic components, said electronic device being capable of withstanding high-energy shocks in a defined direction, as well as to a process for producing said electronic device.

The present invention is particularly well, although not exclusively, suited to recording devices mounted on a moving machine, in particular an aircraft, and liable to be subjected to very high physical stresses, especially when said machine undergoes a shock.

Such recording devices associated, for example, with an aircraft, which record data during the flight of the aircraft and/or at the moment of a shock which may or may not be caused by the latter, must be designed to withstand the thermal, and above all mechanical, stresses which are generated during said shock and are likely to be very high, so as to be able to recover the recorded information.

Such recording devices are used especially for making recordings during in-flight trials, in particular missile trials carried out, for example, during the development of a weapon system using such missiles.

The recording devices, and more particularly the electronic devices, envisaged here contain a set of plane boards carrying electronic components, said boards being mounted so as to be separated from and parallel to one another.

In a known manner, these boards, generally of the same circular shape, are joined together by a plurality of rigid metal rods orthogonal to the planes of the boards and uniformly distributed close to the external periphery of said boards, said metal rods sometimes also providing an electrical connection between the boards.

However, such a mounting solution is very expensive and, in addition, it is not at all satisfactory during a shock provided generally in a direction orthogonal to the planes of said boards since:

- on the one hand, all the stresses generated during such a shock must be absorbed by the previously described structure, which is only rigid and nonelastic; and
- on the other hand, although the metal rods provide relatively good mechanical retention of the boards, especially on the external periphery of the latter, the electronic components mounted on these boards are in no way retained by specific means and are therefore insufficiently fixed for the operations envisaged, so that there is a major risk of these electronic components being pulled out or damaged.

Moreover, these electronic components are not protected from other nonmechanical stresses either, such as, for example, stresses due to the environment, in particular thermal stresses.

The object of the present invention is to overcome these drawbacks. It relates to an electronic device comprising a set of boards carrying electronic components, said boards being mounted so as to be separated from and parallel to one another, said electronic device being capable of withstanding shocks in a defined direction approximately orthogonal to the planes of said boards as well as withstanding very unfavorable environmental stresses.

For this purpose, said electronic device is noteworthy according to the invention in that it comprises a protective body made of an elastomeric substance encapsulating said set of boards, said elastomeric substance filling the spaces between said boards and forming at least one front shield, in the direction of the shocks, for said set of boards.

Thus, by virtue of said front shield and of the elastic properties of the elastomeric substance, said protective body is capable of damping very high energy shocks, and thus of protecting said set of boards from very high mechanical stresses.

In addition, since the elastomeric substance of said protective body fills all the spaces between said boards and therefore encapsulates all the electronic components mounted on said boards, there is no risk of said electronic components being pulled out or damaged, contrary to the aforementioned known devices.

Furthermore, said protective body made of an elastomeric substance has many other advantages, in particular:

- it is impermeable, which affords effective protection, especially from water and dust; and
- it has good thermal resistance over very wide temperature ranges.

Moreover, as the present invention may be employed on any electronic device in accordance with the preamble, it has the advantage of being able to be used in numerous possible applications.

Advantageously, said elastomeric substance forms, in addition, a rear shield for said set of boards, thereby protecting said set of boards from a possible rearward incident shock due to a rebound effect.

Advantageously, said protective body has a cylindrical or parallelepipedal general shape.

In order to produce said protective body, it is preferred to use silicone as the elastomeric substance. Silicone has the advantage of being noninflammable; in the event of a fire (overheating), it withstands 3000° C. for a few seconds and its thermal conductivity is 0.23 W/(m.K). Advantageously, the silicone may in addition be at least partially transparent, allowing at least approximate visual inspection of said set of boards.

Furthermore, advantageously, the front and rear shields of said protective body have peripheral, preferably cone-shaped, recesses, creating spaces allowing expansion of the elastomeric substance during a shock resulting in deformation of said protective body.

Moreover, said electronic device advantageously comprises at least one auxiliary piece, for example a honeycomb disk, mounted in front of the protective body in the direction of the shocks. The crushing of said auxiliary piece during a shock also contributes to the damping, especially by enabling the stop time of the protective body to be increased and thereby reducing the induced shock stresses.

Of course, the electronic device in accordance with the invention may be directly mounted in a suitably shaped housing which is provided in the machine intended to be equipped with said electronic device.

However, in one particularly advantageous embodiment of the invention, said protective body is surrounded by a rigid casing which is preferably made of a composite and intended to be fastened to said machine, making it possible, on the one hand, to provide said electronic device with lateral protection and, on the other hand, to promote damping during a shock because of the friction then existing between said protective body and said rigid casing.

This rigid casing furthermore makes it possible to simplify the production of the electronic device in accordance with the invention, allowing implementation of an advantageous production process in accordance with the invention, this process being detailed hereinbelow.

The present invention in fact relates also to a process for producing the aforementioned electronic device.

For this purpose, said process is noteworthy according to the invention in that:

said set of boards is inserted into said rigid casing provided with openings which are distributed along its longitudinal direction;

the ends of said rigid casing are plugged;

an elastomeric substance is poured into said rigid casing through said openings so that said elastomeric substance encapsulates said set of boards and fills the spaces between said boards; and said elastomeric substance solidifies, thus forming said protective body and at least said front shield.

Thus, by virtue of the invention, said protective body may be produced very simply and it is mounted directly inside the associated rigid casing.

The figures of the appended drawing will make it clearly understood how the invention may be realized. In these figures, identical references designate similar elements.

Figure 1:
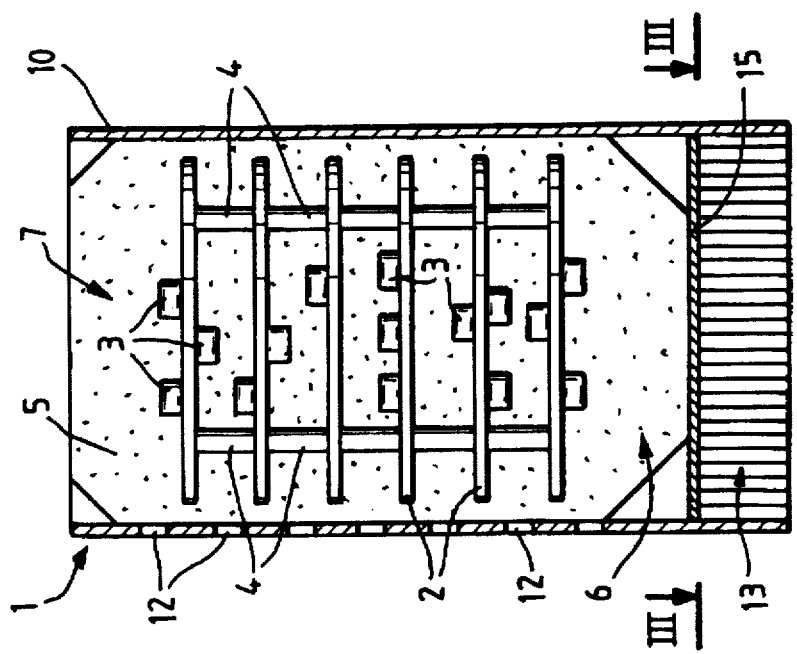
FIG. 1 is a diagrammatic longitudinal section of an electronic device in accordance with the invention, produced according to a first embodiment.

The present invention is applied to an electronic device 1 shown diagrammatically in a first embodiment in FIG. 1.

Said electronic device 1 comprises a set of circular and plane boards 2 carrying electronic components 3 shown diagrammatically in FIG. 1.

Said boards 2 are mounted parallel to one another, being separated from one another by spacer bars 4 uniformly distributed near the periphery of said boards 2.

According to the envisaged embodiment, said spacer bars 4 are:

either fixed individually to the respectively adjacent boards;

or have a hollow shape and are fixed together along a longitudinal direction by a transverse rod, not shown, which is merely fastened, for example by screws, to the outermost boards of said set of boards.

Said electronic device 1 is produced so as to be able to withstand violent shocks in a defined shock direction $\vec{E}$ approximately orthogonal to the planes of said boards 2.

For this purpose, said electronic device 1 comprises, according to the invention, a protective body 5 made of an elastomeric substance and of cylindrical general shape, encapsulating said set of boards 2 and set of electronic components 3, said elastomeric substance filling the spaces between said boards 2 and forming at least one front shield 6, in the direction of the shocks $\vec{E}$, for said set of boards 2.

Said protective body 5 has very many advantages, in particular:

by virtue of said front shield 6 and the elastic properties of the elastomeric substance, it is capable of damping very violent shocks and thus of protecting said set of boards 2 from very high mechanical stresses, for example random vibrations of from 10 to 3000 Hz at 21 $g_{ef}$ ($g_{ef}$ representing the effective acceleration due to gravity) and mechanical shocks of 3500 g (g representing the acceleration due to gravity) in 0.5 ms, for a mass of the electronic device of less than 1 kg;

it has good thermal resistance over a very wide temperature range, for example from −70° C. to more than +200° C. continuously (a few hours);

it is impermeable, thereby providing effective protection from water, dust, etc.; and it prevents the risk of pull-out or damage by movement of said electronic components 3, since said electronic components 3 are encapsulated collectively with the boards 2 by said elastomeric substance.

Preferably, an at least partially transparent elastomeric substance, for example silicone, is used. This transparency enables an approximate visual inspection of said set of boards 2 to be made and especially enables the respective positions of said boards 2 to be known.

In addition, as the elastomeric substance, especially silicone, may generally be rebonded, it is conceivable with the present invention to cut up the protective body 5, after a first use, into cylindrical disks each comprising at least one board 2, and subsequently to bond together again only the boards 2 which are useful for a second use and/or to modify the respective positions of these boards 2. This is particularly advantageous and economical since the same boards may be used for other applications.

As may be seen in FIG. 1, said protective body 5 furthermore comprises a rear shield 7, which is narrower than the front shield 6 and intended to protect said set of boards 2 from a possible rearward incident shock due to a rebound effect.

Said front and rear shields 6 and 7 have peripheral recesses 8 and 9, in the form of an outwardly increasing cone, these being intended to allow expansion of the substance of the protective body 5 during a shock resulting in deformation of said protective body 5.

It will be noted that, for this purpose, the recess 8 is greater than the recess 9 since said recess 8 is intended for the forward initial shock and the recess 9 for a possible rearward incident shock due to a rebound effect.

Moreover, it will be noted that the electrical power supply, not shown, of the electronic device 1 may be provided in various ways left to the imagination of those skilled in the art, depending on the envisaged application. For example, it is possible to provide a battery or a thermal cell which is either incorporated into the protective body 5 or lies outside said protective body 5 and is connected to the set of boards 2 via an electrical connection.

Furthermore, the electronic device 1 in accordance with the invention comprises a rigid casing 10, preferably made of a composite, for example a carbon/epoxy composite, of hollow cylindrical shape surrounding said protective body 5.

Said rigid casing 10 makes it possible to preserve the mechanical integrity of the electronic device 1, which thus has one degree of freedom in the direction of the arrow $\vec{E}$ in order to damp shocks.

This rigid casing 10 is intended to be fastened to the machine, for example an aircraft, which is to be equipped with said electronic device 1.

The frictional forces occurring between said rigid casing 10 and said protective body 5 during a shock also contribute to promoting damping.

It may be pointed out that, in another embodiment, not shown, said protective body 5 may be directly mounted or molded in a suitable housing provided in said machine.

However, said rigid casing 10 has another major advantage. It contributes in making said protective body 5 easier to produce by allowing implementation of a process in accordance with the invention provided for this effect.

According to said process in accordance with the invention, the following operations are carried out:

the set of boards 2 fastened together by the spacer bars 4 is inserted into the rigid casing 10;

said set of boards 2 is fixed to at least three positioning blocks 11 fastened to the internal face of said rigid casing 10;

the ends of the rigid casing 10 are plugged by appropriate means;

an elastomeric substance in the liquid state is poured into said rigid casing 10 through openings 12 provided along the longitudinal direction of said rigid casing 10, said openings 12 being made so as to allow easy flow between the boards 2; and said elastomeric substance solidifies, thus forming said protective body 5 mounted directly in the operating position in the associated rigid casing 10.

Figure 2:
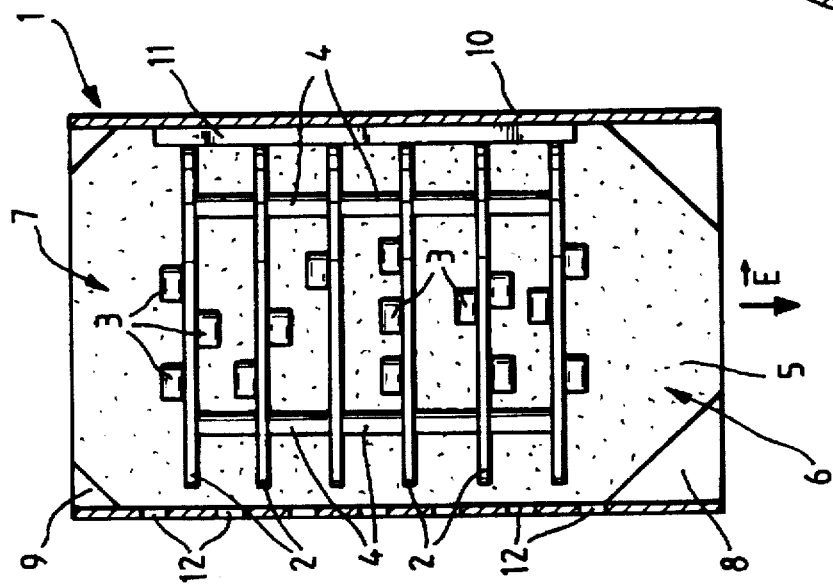
FIG. 2 is a diagrammatic longitudinal section of an electronic device in accordance with the invention, produced according to a second embodiment.

In a second embodiment, shown in FIG. 2, the electronic device 1 comprises, in addition, in front of the front shield 6, an auxiliary piece made in the form of a disk 13.

Figure 3:
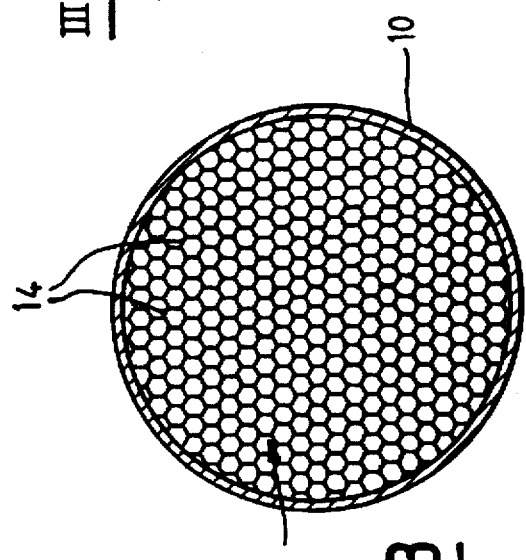
FIG. 3 is a partial section of the electronic device in accordance with the invention, on the line III—III in FIG. 2.

Said disk 13 has a honeycomb shape, for example made of metal, comprising, in cross section, adjacent hexagonal structures 14, as shown in FIG. 3.

Moreover, a metal plate 15 is provided between said protective body 5 and said disk 13.

Because of its special shape, said disk 13 contributes effectively to damping during a shock, since crushing this disk 13 makes it possible to increase the stop time of the protective body 5 and to reduce the induced shock stresses.

This second embodiment shown in FIG. 2 is particularly advantageous when very violent and very high energy shocks are envisaged.

This solution thus uses, in order to withstand the shocks, the combination the frictional forces between the protective body 5 and the rigid casing 10;

the elastic deformation of the protective body 5; and the plastic deformation of the disk 13.

We claim:

1. An electronic device comprising a set of boards (2) carrying electronic components (3), said boards being mounted so as to be separated from and parallel to one another, said electronic device (1) being capable of withstanding shocks in a defined direction approximately orthogonal to the planes of said boards (2), which comprises a protective body (5) made of an elastomeric substance encapsulating said set of boards (2), said elastomeric substance filling the spaces between said boards (2) and forming at least one front shield (6), in the direction of the shocks ($\vec{E}$), for said set of boards (2), said front shield (6) of said protective body (5) having a peripheral conical recess (8) intended to allow expansion of the elastomeric substance during a shock.

2. The electronic device as claimed in claim 1, wherein said elastomeric substance forms a rear shield (7), in the direction of the shocks ($\vec{E}$), for said set of boards (2).

3. The electronic device as claimed in claim 2, wherein said rear shield (7) of said protective body (5) has a peripheral recess (9).

4. The electronic device as claimed in claim 1, wherein said protective body (5) has a cylindrical general shape.

5. The electronic device according to claim 1, wherein said protective body (5) has a parallelepipedal general shape.

6. The electronic device as claimed in claim 1, wherein silicone is used as the elastomeric substance.

7. The electronic device as claimed in claim 1, wherein said elastomeric substance is at least partially transparent.

8. The electronic device as claimed in claim 1, which comprises at least one honeycomb auxiliary piece (13) mounted in front of the protective body (5) in the direction of the shocks ($\vec{E}$).

9. The electronic device as claimed in claim 1, wherein said protective body (5) is surrounded by a rigid casing (10).

10. The electronic device as claimed in claim 9 wherein said rigid casing (10) is made of a composite.

11. A process for producing the electronic device (1) specified in claim 9, wherein:

said set of boards (2) is inserted into said rigid casing (10) provided with openings (12) which are distributed along its longitudinal direction;

the ends of said rigid casing (10) are plugged;

an elastomeric substance is poured into said rigid casing (10) through said openings (12) so that said elastomeric substance encapsulates said set of boards (2) and fills the spaces between said boards (2); and said elastomeric substance solidifies, thus forming said protective body (5) and at least said front shield (6).

* * * * *